(12) United States Patent
Xu et al.

(10) Patent No.: US 12,202,651 B2
(45) Date of Patent: Jan. 21, 2025

(54) DUST-EXCLUDING CARRIER FOR PRODUCT STORAGE

(71) Applicant: TRIPLE WIN TECHNOLOGY(SHENZHEN) CO. LTD., Shenzhen (CN)

(72) Inventors: Hui Xu, Shenzhen (CN); Ching-Huang Lin, Taoyuan (TW)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 275 days.

(21) Appl. No.: 17/898,927

(22) Filed: Aug. 30, 2022

(65) Prior Publication Data
US 2023/0097556 A1 Mar. 30, 2023

(30) Foreign Application Priority Data
Sep. 27, 2021 (CN) .......................... 202111136374.2

(51) Int. Cl.
*B65D 43/02* (2006.01)
*B65D 25/06* (2006.01)
*B65D 25/10* (2006.01)
*B65D 25/28* (2006.01)

(52) U.S. Cl.
CPC ......... *B65D 43/0212* (2013.01); *B65D 25/06* (2013.01); *B65D 25/108* (2013.01); *B65D 25/2826* (2013.01); *B65D 2543/00194* (2013.01); *B65D 2543/0099* (2013.01)

(58) Field of Classification Search
CPC .. B65D 25/06; B65D 25/108; B65D 25/2826; A47B 2210/08
USPC ....................................... 220/23.88
See application file for complete search history.

(56) References Cited

U.S. PATENT DOCUMENTS

| | | | | | |
|---|---|---|---|---|---|
| 2,625,456 | A | * | 1/1953 | Rostau | A47F 5/0025 312/351 |
| 3,738,728 | A | * | 6/1973 | Eckard | A47B 88/944 312/333 |
| 3,939,982 | A | * | 2/1976 | Russell | B65D 25/04 220/23.88 |

* cited by examiner

*Primary Examiner* — Jeffrey R Allen
(74) *Attorney, Agent, or Firm* — ScienBiziP, P.C.

(57) ABSTRACT

A dust-excluding carrier for product storage comprises a housing cavity and dust-excluding isolation members. The dust-excluding isolation member comprises a first main body, the first main body is provided with a first opening; the material tray and the dust-excluding isolation member are detachably connected. The material tray comprises a second main body with a second opening. The first main body and the second main body may be snap-fitted together and apart, so the first opening is covered by the second body and the second opening covered by the first body.

16 Claims, 4 Drawing Sheets

DUST-EXCLUDING CARRIER FOR PRODUCT STORAGE

FIELD

The subject matter relates to product handling, in particular to a dust-excluding carrier.

BACKGROUND

Storage requirements for products which are more delicate are strict and can be critical. In the current industrial production field, most of the products are stored in a clip-on manner. The products in the tray are placed frontally upwards, exposed to the atmosphere. There is no effective dust-excludinging structure, the surface of the product is completely exposed, the external dust will fall more easily into the surface of the product, resulting in an increase in the defect rate of the product.

DETAILED DESCRIPTION

The technical solutions of the present invention will be clearly and completely described below in conjunction with embodiments. Obviously, the described embodiments are a part of the embodiments of the present invention, but not all of the embodiments. Based on the embodiments of the present invention, all other embodiments obtained by those of ordinary skill in the art without creative work shall fall within the protection scope of the present invention.

Figure 1:
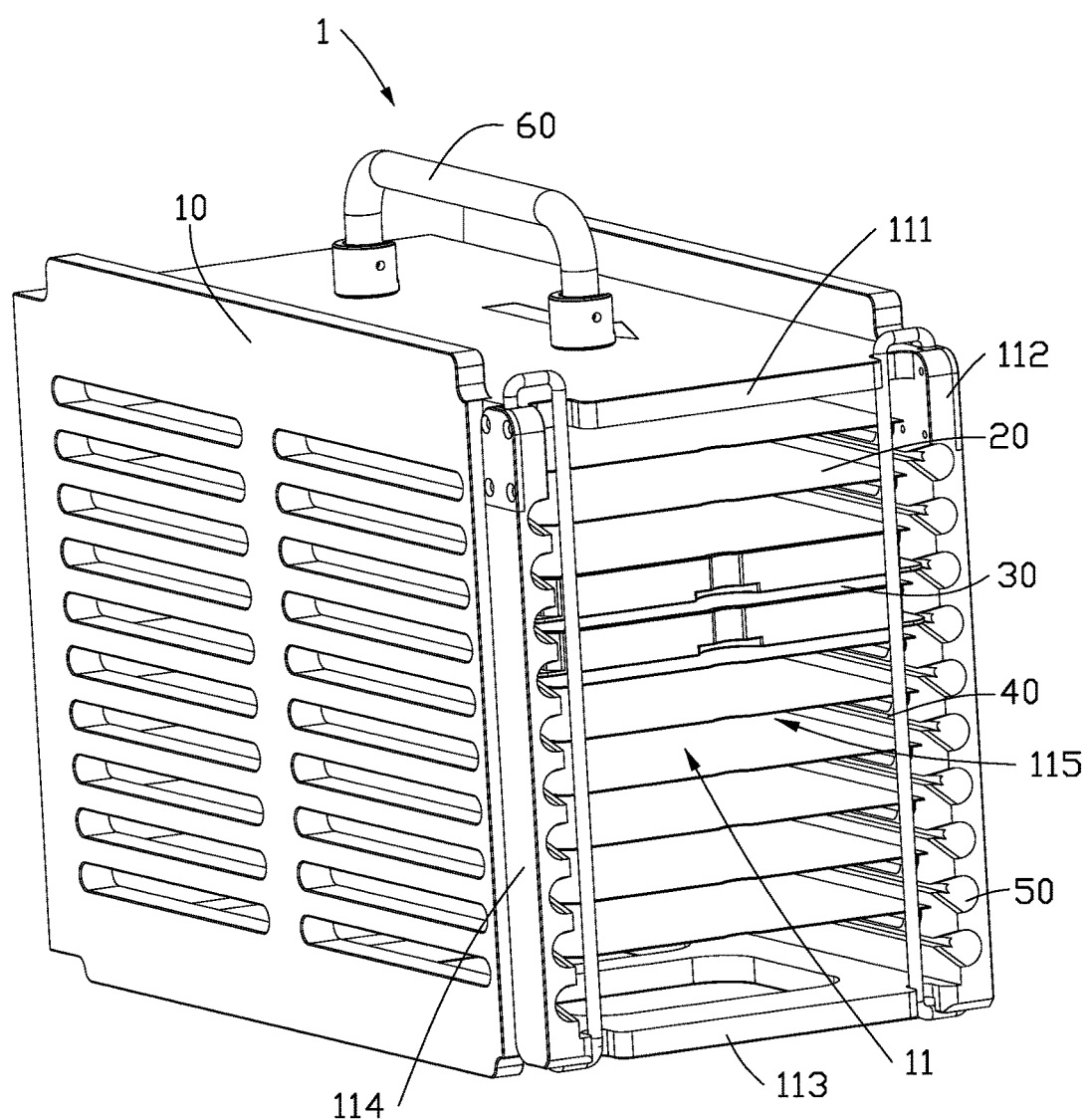
FIG. 1 is a structural view of a dust-excluding carrier.

As shown in FIG. 1, an embodiment of the present invention provides a dust-excluding carrier 1. The dust-excluding carrier 1 includes a box 10, a dust-excluding isolation member 20, and a material tray 30.

The box 10 provides an accommodating cavity 11. The shape of the box 10 is a rectangular parallelepiped as the main structure, a slot 115 is provided on one side of the box 10, and a handle 60 is provided on the outer side of the box 10. The box 10 includes a first side wall 111, a second side wall 112, a third side wall 113, and a fourth side wall 114.

The first side wall 111 is vertically connected to the second side wall 112 and the fourth side wall 114, and the third side wall 113 is vertically connected to the second side wall 112 and the fourth side wall 114.

The first side wall 111 is parallel to the third side wall 113, and the second side wall 112 is parallel to the fourth side wall 114.

The first side wall 111, the second side wall 112, the third side wall 113, and the fourth side wall 114 together form a slot 115. The material tray 30 is put into the accommodating cavity 11 through the slot 115. The material tray 30 can also be taken out from the accommodating cavity 11. Thereby improving the convenience of accessing the material tray 30.

The handle 60 is disposed on the side of the first side wall 111 away from the accommodating cavity 110. The handle 60 is fixedly connected to the first side wall 111. The handle 60 allows convenience in carrying the box 10.

The dust-excluding isolation member 20 is arranged in the accommodating cavity 11, and the dust-excluding isolation member 20 is connected with the box 10. The dust-excluding carrier 1 includes a plurality of dust-excluding isolation members 20 arranged at intervals, and the multiple dust-excluding isolation members 20 are stacked in the accommodating cavity 11.

Figure 2:
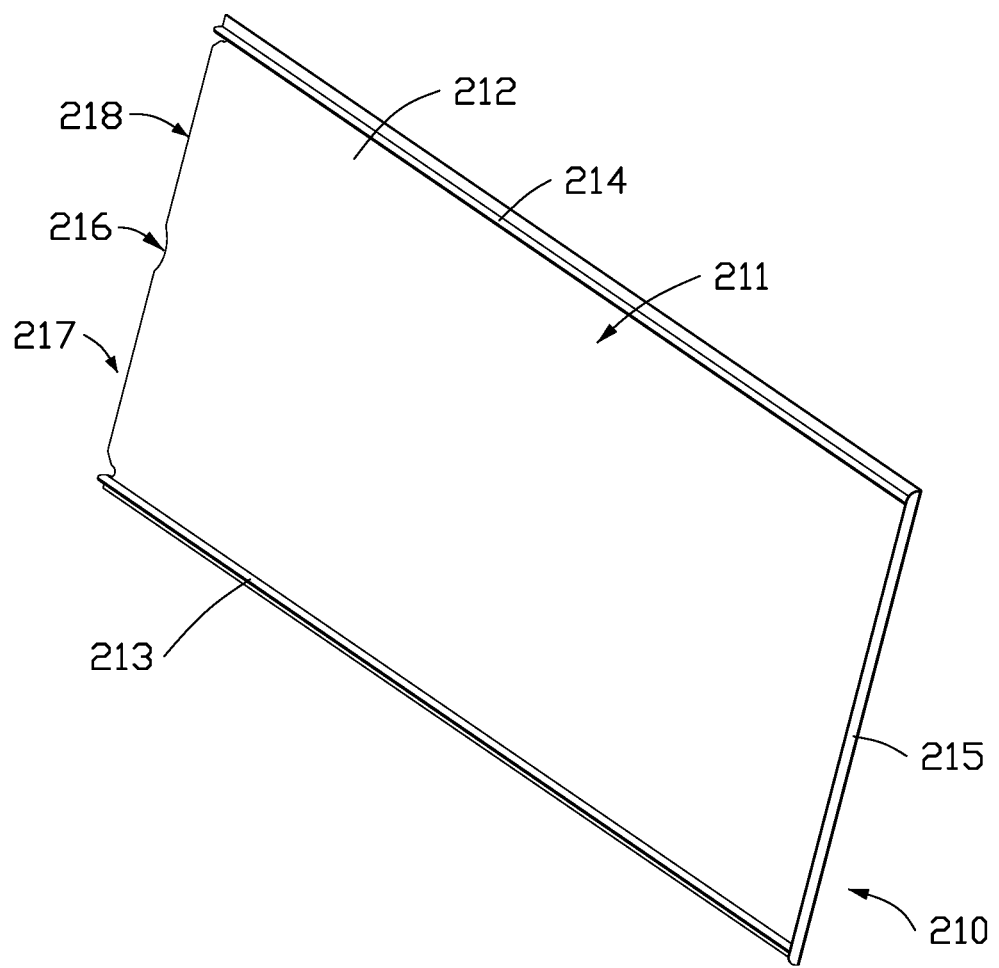
FIG. 2 is a frontal view of a first main body of the carrier shown in FIG. 1.

Further referring to FIG. 2, the dust-excluding isolation member 20 includes a first main body portion 210, and the first main body portion 210 is provided with a first opening 211. The first main body portion 210 includes a cover plate 212, a first side plate 213, a second side plate 214, and a third side plate 215. The first side plate 213 and the second side plate 214 are connected to the cover plate 212. The first side plate 213 and the second side plate 214 are disposed on opposite sides of the cover plate 212. The third side plate 215 is connected to the cover plate 212, the first side plate 213, and the second side plate 214. A third opening 217 is provided at the edge of the connection between the first side plate 213, the second side plate 214, and the cover plate 212. The first side plate 213 is connected to the second side wall 112 so as to be connected to the box 10. The second side plate 214 is connected to the fourth side wall 114 so as to be connected to the box 10.

Preferably, the first main body portion 210 may be a rectangular parallelepiped structure in a semi-closed state, the flatness thereof should be controlled to be within 0.1 mm to ensure the dust-excluding effect.

The material tray 30 is detachably connected to the dust-excluding isolation member 20. The material tray 30 is used to hold the product. In this embodiment, the dust-excluding carrier 1 includes a plurality of material trays 30 arranged at intervals, and the plurality of material trays 30 are stacked in the accommodating cavity 11.

Figure 3:
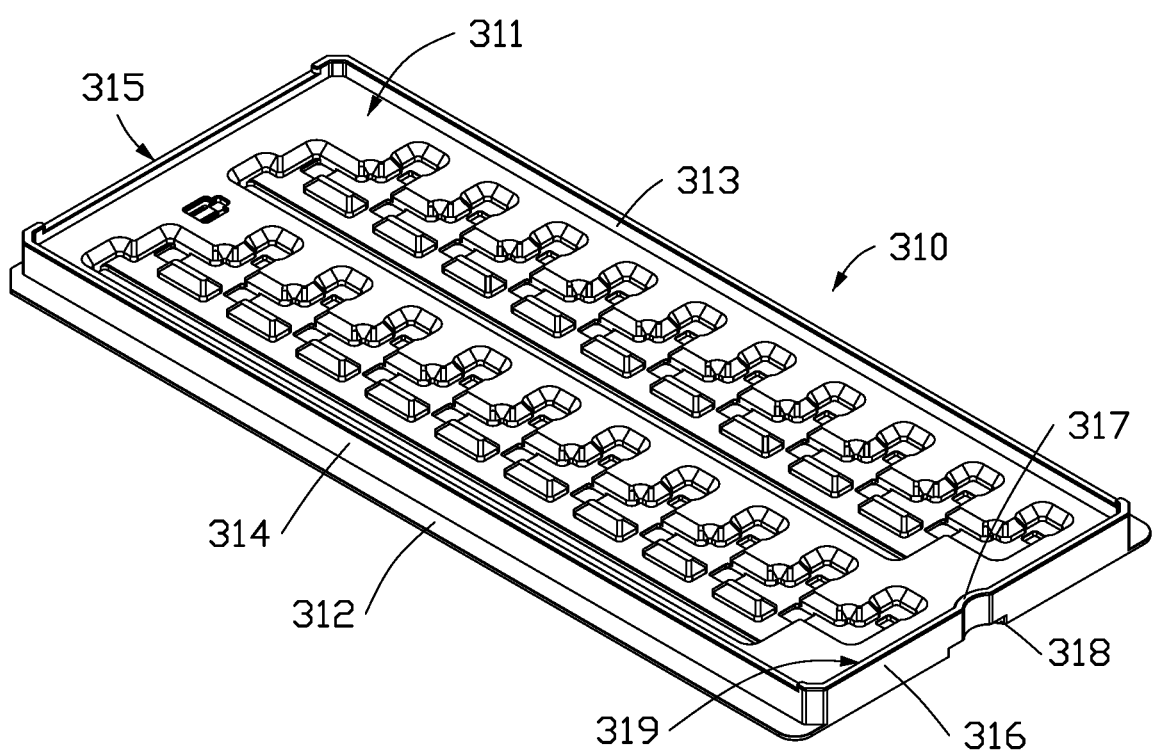
FIG. 3 is a frontal view of a second main body of the carrier shown in FIG. 1.

Further as shown in FIG. 3, the material tray 30 includes a second main body portion 310. The second main body portion 310 defines a second opening 311. The second main body portion 310 includes a bottom plate 312, a fourth side plate 313, a fifth side plate 314, a sixth side plate 315, and a seventh side plate 316. The fourth side plate 313 and the fifth side plate 314 are connected to the bottom plate 312. The fourth side plate 313 and the fifth side plate 314 are disposed on opposite sides of the bottom plate 312. The sixth side plate 315 and the seventh side plate 316 are connected to the bottom plate 312. The sixth side plate 315 and the seventh side plate 316 are disposed on opposite sides of the bottom plate 312. The sixth side plate 315 is connected to the fourth side plate 313 and the fifth side plate 314. The seventh side plate 316 is connected to the fourth side plate 313 and the fifth side plate 314. The fourth side plate 313, the fifth side plate 314, the sixth side plate 315, and the seventh side plate 316 are connected and enclosed to form a second opening 311.

Preferably, the second main body portion 310 may be a semi-closed cuboid structure, and the flatness thereof should be controlled to be within 0.1 mm to ensure the dust-excluding effect.

A concave portion 216 is formed on the side of the cover plate 212 opposite to the third side plate 215, and a protruding portion 317 is formed on the side of the seventh side plate 316 away from the sixth side plate 315. The concave portion 216 matches the shape of the protruding portion 317. When the dust-excluding isolation member 20 and the material tray 30 are engaged with each other, the concave portion 216 and the protruding portion 317 cooperate with each other to form a closed space between the dust-excluding isolation member 20 and the material tray 30.

A first sealing structure 218 is provided on the side of the cover plate 212 opposite to the third side plate 215. A second sealing structure 319 is provided on the side of the bottom plate 312 opposite to the sixth side plate 315. The first sealing structure 218 matches the shape of the second sealing structure 319. The shapes of the first sealing structure 218 and the second sealing structure 319 are not limited. The first sealing structure 218 and the second sealing structure 319 cooperate with each other to prevent dust from entering.

A concave structure 318 is provided on the outer side of the seventh side plate 316 away from the sixth side plate 315. The concave structure 318 is used to prevent exposure of the product in the material tray 30 to external dust when the material tray 30 is being accessed.

The dust-excluding carrier 1 also includes slide rails 40. The slide rail 40 is arranged in the box 10, and the material tray 30 is movably connected to the box 10 through the slide rail 40. There are several slide rails 40. The slide rails 40 are stacked in the box 10. The slide rails 40 are each fixedly connected to the second side wall 112 and the fourth side wall 114. The connection between the slide rail 40 and the box 10 coincides with the connection between the dust-excluding isolation member 20 and the box 10. The material tray 30 slides into the dust-excluding isolation member 20 along the slide rail 40 to improve the convenience of accessing the material tray 30.

The dust-excluding isolation member 20 is also used for stably locating the material tray 30. When the material tray 30 slides into the box 10 through the slide rail 40, the dust-excluding isolation member 20 and the material tray 30 are engaged with each other, the third side plate 215 is in contact with the sixth side plate 315, and the first sealing structure 218 is in contact with the second sealing structure 319. The two sealing structures 319 abut against each other. Fixing the dust-excluding isolation member 20 in the box 10 can prevent the material tray 30 from sliding out of the box 10, so that the placement position of the material tray 30 in the box 10 is always accurate.

The side of the box 10 with the slot 115 is provided with a fixing buckle 50. The fixing buckles 50 are disposed at the connection between the second side wall 112 and the material tray 30 and the connection between the fourth side wall 114 and the material tray 30. The fixing buckle 50 is adapted to the structure of the side edge of the material tray 30, but the fixing buckle 50 is not provided on the side of the box 10 opposite to the slot 115. Therefore, the material tray 30 can only be put into the accommodating cavity 110 or taken out from the accommodating cavity 110 through the slot 115, so as to realize a certain regulated handling of the material tray 30.

In this embodiment, by disposing the dust-excluding isolation member 20 in the dust-excluding carrier 1, external dust is prevented from falling into the surface of the product.

Figure 4:
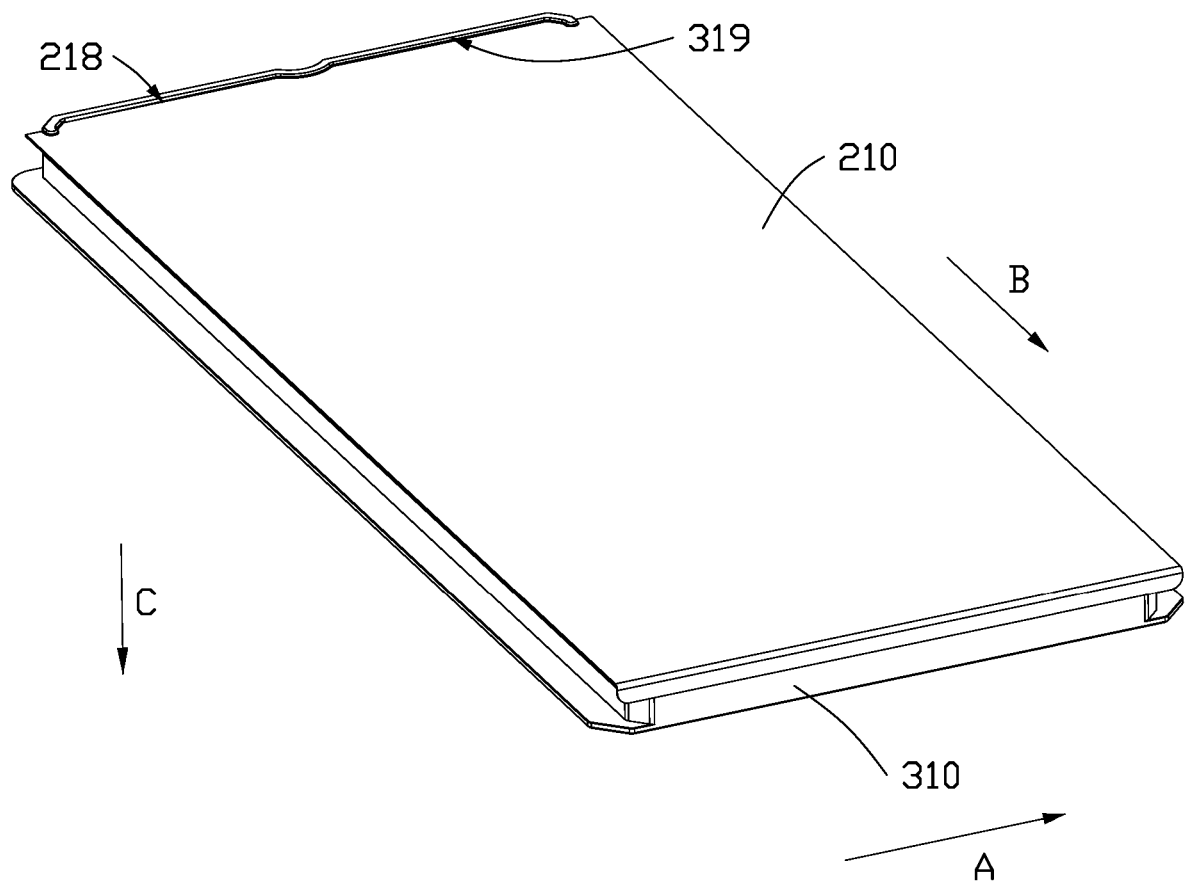
FIG. 4 is a schematic view of the combination of the first main body shown in FIG. 2 and the second main body shown in FIG. 3.

As shown in FIG. 4, when the first main body portion 210 and the second main body portion 310 are fastened together, the cover plate 212 and the third side plate 215 cover the second opening 311, and the bottom plate 312 and the sixth side plate 315 cover the first opening 211 of the first body portion 210. Along the first direction A, the orthographic projection of the first side plate 213 overlaps with the orthographic projection of the fifth side plate 314, and the orthographic projection of the second side plate 214 overlaps with the orthographic projection of the fourth side plate 313. Along the second direction B, the orthographic projection of the third side plate 215 overlaps with the orthographic projection of the sixth side plate 315 or the seventh side plate 316. Along the third direction C, the orthographic projection of the cover plate 212 overlaps with the orthographic projection of the bottom plate 312. The first direction A is perpendicular to the second direction B.

When the first main body portion 210 and the second main body portion 310 are fastened together, the size of the gap between the first side plate 213 and the fourth side plate 313 does not exceed 0.33 m, and the size of the gap between the second side plate 214 and the fifth side plate 314 does not exceed 0.33 m. The size of the gap between the first side plate 213 and the second side plate 214 and the bottom plate 312 is not more than 0.5 mm, so as to improve the dust-excluding effect.

When the first body portion 210 and the second main body portion 310 are fastened together, the shapes of the first sealing structure 218 and the second sealing structure 319 match.

The first main body portion 210 and the second main body portion 310 cover each other to form an airtight and dust-excluding structure.

In the dust-excluding carrier 1 provided by the present application, the dust-excluding isolation member 20 is provided, so that the dust-excluding isolation member 20 and the material tray 30 are fastened to each other to form a closed dust-excluding structure. The sealing performance of the dust-excluding carrier 1 is improved, the problem of product-pollution by dust during storage is reduced, and the yield of the product is improved.

The embodiments shown and described above are only examples. Even though numerous characteristics and advantages of the present technology have been set forth in the foregoing description, together with details of the structured and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. A dust-excluding carrier comprising:
   a box, an accommodating cavity defined in the box;
   a dust-excluding isolation member disposed in the accommodating cavity, the dust-excluding isolation member being connected to the box, and the dust-excluding isolation member comprising a first main body portion, and a first opening defined on the first main body portion;
   a material tray detachably connected to the dust-excluding isolation member, the material tray comprising a second main body portion, and a second opening defined on the second main body portion;
   wherein the first main body portion and the second main body portion are detachably fastened, the first opening is covered by the second main body portion, and the second opening is covered by the first main body portion;
   the first main body portion comprises a cover plate, a first side plate, a second side plate and a third side plate, and the first side plate and the second side plate is connected to the cover plate, the first side plate and the second side plate are arranged on opposite sides of the cover plate, the third side plate is connected to the cover plate, the first side plate and the second side plate, the first side plate and the second side plate is connected to the box;

the second main body portion comprises a bottom plate, a fourth side plate, a fifth side plate, a sixth side plate and a seventh side plate, the fourth side plate and the fifth side plate is connected to the bottom plate, the fourth side plate and the fifth side plate are arranged on opposite sides of the bottom plate, the sixth side plate and the seventh side plate connected with the bottom plate, the sixth side plate and the seventh side plate are arranged on opposite sides of the bottom plate, the sixth side plate and the seventh plate are respectively connected with the fourth side plate and the fifth side plate;

the first side plate, the second side plate and the third side plate are disposed on a side of the cover plate opposed to the bottom plate, the fourth side plate, the fifth side plate, the sixth side plate and the seventh side plate are disposed on a side of the bottom plate opposed to the cover plate, the bottom plate is connected to the box; and along a first direction, a orthographic projection of the first side plate overlaps with a orthographic projection of the fourth side plate, a orthographic projection of the second side panel overlaps with a orthographic projection of the fifth side panel; along a second direction, a orthographic projection of the third side panel overlaps with a orthographic projection of the sixth side panel or a orthographic projection of the seventh side panel; along a third direction, a orthographic projection of the cover plate overlaps a orthographic projection of the bottom plate.

2. The dust-excluding carrier of claim 1, wherein the dust-excluding carrier further comprises a sliding rail, the sliding rail is arranged in the box, the material tray is connected with the box through the slide rail.

3. The dust-excluding carrier of claim 1, wherein when the first main body portion and the second main body portion are fastened together, the cover plate and the third side plate cover the second opening, the bottom plate and the sixth side plate cover the first opening.

4. The dust-excluding carrier of claim 1, wherein a size of a gap between the first side plate and the fifth side plate is not more than 0.33 meter (m), and the second side plate and a size of a gap between the fourth side plate does not exceed 0.33 m; a size of a gap between the first side plate and the bottom plate does not exceed 0.5 millimeter (mm), and a size of a gap between the second side plate and the bottom plate does not exceed 0.5 mm.

5. The dust-excluding carrier of claim 1, wherein a concave portion is provided on a side of the cover plate connected to the third side plate; the seventh side plate is provided with a protruding portion, so that the protruding portion is matched with the concave portion.

6. The dust-excluding carrier of claim 1, wherein a side surface of the box is provided with a fixing buckle, and the first body portion and the second main body portion are matched through the fixing buckle.

7. The dust-excluding carrier of claim 1, wherein the seventh side plate is provided with a concave structure for preventing the material tray from contacting dust.

8. The dust-excluding carrier of claim 1, wherein the box comprises a first side wall, a second side wall, a third side wall and a fourth side wall which are connected in sequence.

9. The dust-excluding carrier of claim 8, wherein the first side wall is vertically connected to the second side wall and the fourth side wall, and the third side wall is vertically connected to the second side wall and the fourth side wall.

10. The dust-excluding carrier of claim 8, wherein the first side wall is parallel to the third side wall, and the second side wall is parallel to the fourth side wall.

11. The dust-excluding carrier of claim 8, wherein the first side wall, the second side wall, the third side wall and the fourth side wall are enclosed to form a slot, the material tray is put into the accommodating cavity through the slot.

12. The dust-excluding carrier of claim 1, wherein a handle is provided on the outer side of the box, the handle is disposed on the side of the first side wall away from the accommodating cavity, the handle is fixedly connected to the first side wall.

13. The dust-excluding carrier of claim 1, wherein the first main body portion and second main body portion is a semi-closed cuboid structure, and the flatness of the first main body portion and second main body portion is controlled within 0.1 mm.

14. The dust-excluding carrier of claim 1, wherein a first sealing structure is provided on the side of the cover plate opposite to the third side plate, a second sealing structure is provided on the side of the bottom plate opposite to the sixth side plate.

15. The dust-excluding carrier of claim 14, wherein the first sealing structure matches the shape of the second sealing structure, the first sealing structure and the second sealing structure cooperate with each other to prevent dust from entering.

16. The dust-excluding carrier of claim 2, wherein the number of the slide rails is plural, the plurality of slide rails are stacked in the box.

* * * * *